(12) United States Patent
Tanaka et al.

(10) Patent No.: US 7,923,270 B2
(45) Date of Patent: Apr. 12, 2011

(54) LIGHT-EMITTING DEVICE AND ITS MANUFACTURING METHOD

(75) Inventors: Kenichiro Tanaka, Neyagawa (JP); Masao Kubo, Nara (JP)

(73) Assignee: Panasonic Electric Works Co., Ltd., Osaka (JP)

( * ) Notice: Subject to any disclaimer, the term of this patent is extended or adjusted under 35 U.S.C. 154(b) by 0 days.

(21) Appl. No.: 12/410,069

(22) Filed: Mar. 24, 2009

(65) Prior Publication Data

US 2009/0186431 A1 Jul. 23, 2009

Related U.S. Application Data

(62) Division of application No. 10/565,601, filed as application No. PCT/JP2004/014464 on Sep. 24, 2004.

(30) Foreign Application Priority Data

Sep. 24, 2003 (JP) ................................. 2003-331060

(51) Int. Cl.
*H01L 21/00* (2006.01)

(52) U.S. Cl. .......... 438/22; 438/478; 438/669; 438/629; 438/700; 438/672; 257/774; 257/79; 257/E21.577; 257/225; 257/103

(58) Field of Classification Search .................... 438/22, 438/478, 669, 629, 637, 639, 667, 700; 257/774, 257/79–103, E21.577
See application file for complete search history.

(56) References Cited

U.S. PATENT DOCUMENTS

| | | | |
|---|---|---|---|
| 5,693,963 A * | 12/1997 | Fujimoto et al. | 257/94 |
| 6,316,785 B1 * | 11/2001 | Nunoue et al. | 257/14 |
| 6,333,522 B1 | 12/2001 | Inoue et al. | |
| 6,365,429 B1 | 4/2002 | Kneissl et al. | |
| 6,448,102 B1 | 9/2002 | Kneissl et al. | |
| 6,744,800 B1 | 6/2004 | Kneissl et al. | |

(Continued)

FOREIGN PATENT DOCUMENTS

EP 0921577 6/1999

(Continued)

OTHER PUBLICATIONS

Patent Abstract of Japan, vol. 2000, No. 10, Nov. 17, 2000.

*Primary Examiner* — Jerome Jackson, Jr.
*Assistant Examiner* — Dale Page
(74) *Attorney, Agent, or Firm* — Greenblum & Bernstein, P.L.C.

(57) ABSTRACT

In a light-emitting device and its manufacturing method, mounting by batch process with surface-mount technology, high light extraction efficiency, and low manufacturing cost are realized. The light-emitting device comprises semiconductor layers of p-type and n-type nitride semiconductor, semiconductor-surface-electrodes to apply currents into each of the semiconductor layers, an insulating layer which holds the semiconductor layers, and mount-surface-electrodes. The semiconductor layers has a non-deposited area where the other semiconductor layer is not deposited. The insulating layer has VIA which electrically connect the mount-surface-electrodes and the semiconductor-surface-electrodes. In the manufacturing process, firstly, semiconductor layers and semiconductor-surface-electrodes are deposited on the transparent crystal substrate, and by using build-up process, insulating layer and the mount-surface-electrodes are formed, and secondly, VIA are formed, and finally, the transparent crystal substrate is separated to get light-emitting device. Light can be extracted directly and efficiently from the semiconductor layers. With the mount-surface-electrodes, light-emitting device can be mounted by using surface mount technology.

6 Claims, 12 Drawing Sheets

U.S. PATENT DOCUMENTS

| | | |
|---|---|---|
| 6,878,973 B2 | 4/2005 | Lowery et al. |
| 2002/0024053 A1 | 2/2002 | Inoue et al. |
| 2002/0081773 A1 | 6/2002 | Inoue et al. |
| 2003/0038294 A1 | 2/2003 | Sano |
| 2003/0160258 A1 | 8/2003 | Oohata |
| 2004/0105471 A1 | 6/2004 | Kneissl et al. |
| 2004/0259282 A1 | 12/2004 | Oohata |
| 2005/0012109 A1 | 1/2005 | Kohno et al. |
| 2005/0186763 A1 | 8/2005 | Oohata |

FOREIGN PATENT DOCUMENTS

| | | |
|---|---|---|
| EP | 1460694 | 9/2004 |
| JP | 2000-196197 | 7/2000 |
| WO | 03/044872 | 5/2003 |

* cited by examiner

U.S. 7,923,270 B2

LIGHT-EMITTING DEVICE AND ITS MANUFACTURING METHOD

CROSS-REFERENCE TO RELATED APPLICATIONS

This application is a divisional of application Ser. No. 10/565,601 filed Jan. 24, 2006, which is a national stage of PCT/JP04/14464, filed Sep. 24, 2004, which claims priority to Japanese Application No. 2003-331060, filed Sep. 24, 2003, the disclosures of which are incorporated by reference herein in their entireties.

TECHNICAL FIELD

The present invention relates to a light-emitting device and its manufacturing method.

BACKGROUND ART

Conventionally, there have been technologies for mounting semiconductor light-emitting devices made of light-emitting diode onto a substrate by using wire bonding or flip-chip mounting. Because those technologies require high precision placement, such a light-emitting device is expected that it can be mounted in batch process using surface-mount technology.

Recently, a light-emitting device using nitride semiconductors is largely applied as a semiconductor light-emitting device. Such a light-emitting device is manufactured by depositing semiconductors on a sapphire substrate, so lights from such a device are extracted through the transparent sapphire substrate. However, there exist differences of index of refraction between semiconductor thin film and sapphire substrate, and also between sapphire substrate and the atmosphere, and thus a part of lights is confined in a chip of the device and radiated as heat. In the case that the lights are extracted from the semiconductor surface opposite to the sapphire substrate and lights do not go through the sapphire substrate, therefore the device can be mounted at the sapphire substrate side, however heat release efficiency is not good because of the interposition of sapphire substrate. Thus such a technology is proposed that the sapphire substrate is removed and a heat sink is attached on the place where the substrate is removed (e.g., Japanese Laid-Open Patent Publication No. 2000-196197).

Subsequently, above-mentioned technology, removing the sapphire substrate, is described. This technology is used in the production of laser diode array which is a collective of multiple laser diodes. FIG. 19A-19F show a series of laser diode array manufacturing process. As shown in FIG. 19A, a laser diode array is made on the sapphire substrate with thin film layers of semiconductor 102 and electrodes 121. Next, as shown in FIG. 19B, the surface provided with electrodes 121 and is opposite to the sapphire substrate is glued with the wax 103 to the support substrate 104 to support the array including the sapphire substrate.

In this situation, by applying laser beams 105 to the semiconductor 102 through the sapphire substrate, thin GaN layer pre-formed on the surface of the semiconductor 102 is decomposed to metal Ga and $N_2$, and as shown in FIG. 19C, the sapphire substrate is separated and is removed.

In the next step, as shown in FIG. 19D, a metal layer 106 is formed on the surface of the semiconductor 102, where the sapphire substrate was removed, and thermal conductive substrate 108 is prepared which has a metal layer 107 (if metal substrate is used, metal layer 107 is not necessary). Next, as shown in FIG. 19E, semiconductor 102 and thermal conductive substrate (heat sink) 108 are bonded at each metal layer by solder layer 109. As shown in FIG. 19F, wax 103 is melted to complete laser diode array which is composed of semiconductor 102 and electrodes 121 supported on the thermal conductive substrate 108.

As described above, by removing a sapphire substrate, and attaching a thermal conductive substrate on a place where the sapphire substrate existed, flip side contacts on common surface can be made for all laser diodes in the array. Besides, heat sink is effectively used. The technology to remove a sapphire substrate can be applied not only to a laser diode but also to a semiconductor light-emitting device such as a light-emitting diode (LED).

However, as to above-mentioned method to remove a sapphire substrate, to form electrodes, or to bond a heat sink as shown in FIG. 19A-19F or patent document, many process steps are necessary, and the cost for preparing the support substrate is high. Moreover, since light beams are extracted from the surface where electrodes are provided, there is a problem that the light extraction efficiency of the light-emitting device becomes low.

DISCLOSURE OF INVENTION

The present invention is carried out to solve the above-mentioned problems and aimed to provide a light-emitting device and its manufacturing method, which can be mounted in batch process by using surface-mount technology, and which has high light extraction efficiency, and which can be manufactured at low cost.

For accomplishing the above-mentioned purpose, according to the present invention, a light-emitting device formed by depositing p-type and n-type nitride semiconductor layers, comprising:

semiconductor-surface-electrodes to apply currents into each of the semiconductor layers;

an insulating layer which holds the semiconductor layers; and mount-surface-electrodes provided on one surface of the insulating layer which is opposite to the other surface of the insulating layer where the semiconductor-surface-electrodes are made;

wherein one of the semiconductor layers has a non-deposited area where the other semiconductor layer is not deposited;

one of the semiconductor-surface-electrodes is built up on the surface of the non-deposited area;

VIA's are made in the insulating layer which connect electrically the semiconductor-surface-electrodes and the mount-surface-electrodes; and the semiconductor-surface-electrodes, the insulating layer, and the mount-surface-electrodes are built up in this order on one side of the deposited semiconductor layers.

By such a configuration, since mount-surface-electrodes electrically connected to the semiconductor-surface-electrodes with VIA are provided on the surface of the insulating layer, unlike the semiconductor mounting technology which is using wire-bonding, flip-chip-bonding or the like, it is possible to mount the light-emitting device by using the mount-surface-electrodes, and by using the surface-mount technology which is widely-applied in the print-circuit board process. Furthermore, since there are no obstacles on one of the surfaces of semiconductor layers such a sapphire substrate or electrodes and from which light beams are extracted, unlike the conventional devices, it is possible to extract light beams directly and efficiently from the semiconductor layers to outside.

Preferably, in the light-emitting device, wherein the insulating layer is made of one of resin, ceramics, or silicon.

By such a configuration, it is possible to get such light-emitting devices having reasonably selected material for the insulating layer in respect of the manufacturing cost or product performance.

Preferably, in the light-emitting device, wherein the VIA is filled with electric conductor.

By such a configuration, since electric conductor is generally good thermal conductor, the heat generated at semiconductor layers, which constitute light-emitting portion, can be efficiently radiated through the electric conductor filled in the VIA's to the board on which the device is mounted, and it is possible to lower the thermal load to the light-emitting device, and is possible to realize stable light extraction and long life-time of the light-emitting device.

Preferably, in the light-emitting device, wherein phosphor is provided on the surface or in the interior portion of the semiconductor layer.

By such a configuration, it is possible to convert the color tone of the light emitted by the semiconductor layers into another color tone with high efficiency by using the phosphor. Furthermore, in the case that the light-emitting device is sealed with resin or the like, it is possible to suppress the deterioration of the sealing resin, because phosphor is not dispersed in the sealing resin.

For accomplishing the above-mentioned purpose, according to the present invention, a manufacturing method of light-emitting device, comprising:

a substrate forming process in which a semiconductor-substrate is formed by depositing p-type and n-type semiconductor layers on a transparent crystal substrate with a partly non-deposited portion, and by providing semiconductor-surface-electrodes on the semiconductor layers to apply currents into each of the semiconductor layers, wherein each of the electrode surfaces is exposed in one direction;

VIA forming process in which an insulating layer is formed on the surface of the semiconductor-substrate where the semiconductor-surface-electrodes are provided, also holes for VIA are made by partly removing the insulating layer over the semiconductor-surface-electrodes, also electric conductors are provided to form VIA's on the exposed surfaces of the semiconductor-surface-electrodes exposed by the insulator removals and on the inner walls of the holes for VIA, and also mount-surface-electrodes electrically connected to the semiconductor-surface-electrodes through the VIA are made on the surface of the insulating layer; and substrate separation process in which the transparent crystal substrate is separated off from the semiconductor layers after the VIA forming process.

By such a configuration, it is possible to manufacture low cost and of high efficiency light-emitting device by applying the conventional print-circuit board manufacturing process. That is, in the VIA forming process, it is possible to form the insulating layer for supporting the semiconductor layers and the mount-surface-electrodes for mounting the device on the semiconductor layers by using build-up or substrate depositing process of the conventional print-circuit board process. Since the light-emitting device completed by the removal of transparent crystal substrate has the mount-surface-electrodes on the surface of the insulating layer, it is possible to do surface mounting without using the semiconductor mount technology such the wire-bonding, flip-chip-bonding or the like. Furthermore, since the transparent crystal substrate is separated and removed, it is possible directly to extract light beams from the light emitting portion constituted by semiconductor layers. Thus this light-emitting device is excellent in both of mountability and light-emitting efficiency, and can be manufactured at low cost.

Preferably, in the manufacturing method of light-emitting device, wherein the insulating layer is made of one of resin, ceramics, or silicon.

By such a configuration, it is possible to get such light-emitting devices having reasonably selected material for the insulating layer in respect of the manufacturing cost or products performance.

Preferably, in the manufacturing method of light-emitting device, wherein the insulating layer formed in the VIA forming process is made of a insulating material of resin coated copper.

By such a configuration, it is possible to use the resin coated copper of the conventional print-circuit board process, and also it is possible to do the substrate forming process and the VIA forming process by using the conventional print-circuit board process.

Preferably, in the manufacturing method of light-emitting device, wherein the partial removal of the resin over the semiconductor-surface-electrodes in the VIA forming process is done firstly by removing copper foils located on pre-defined resin of the resin coated copper, and secondly using the remained foil as a mask for resin removal process.

By such a configuration, in the case that laser beams are used to remove resin, it is possible to process the resin with high precision without any precise positioning of laser beams. And also, in the case that plasma is used to remove resin, it is no need to prepare a mask material.

Preferably, in the manufacturing method of light-emitting device, wherein the partial removal of the insulating layer over the semiconductor-surface-electrodes in the VIA forming process is done by exposing the insulating layer to laser beams or plasma.

By such a configuration, in the case that laser beams are used, it is possible to selectively remove only insulating layer by adjusting the process condition, and also high-precision processing can be done. Furthermore, no vacuum system is necessary, and then it is possible to process in the atmosphere conveniently and in high speed. In the case that plasma is used, it is possible to process many number of VIA, and also many substrates can be processed in batch to form VIA efficiently.

Preferably, in the manufacturing method of light-emitting device, wherein the separation of the transparent crystal substrate in the substrate separation process is done by using laser beams.

By such a configuration, it is possible to remove the transparent crystal substrate with the least damage to the semiconductor by concentrating energy in space and time, and this is done conveniently in the atmosphere and in high speed.

Preferably, in the manufacturing method of light-emitting device, wherein a roughness structure is formed on a separation-induced surface of the semiconductor layers simultaneously with the separation of the transparent crystal substrate from the semiconductor layers by using laser beams.

By such a configuration, it is possible to cut down the operation for set-up or arrangement. Furthermore, since the light reflection at the surface of the semiconductor layers for outgoing light is suppressed by the roughness structure on the surface of the semiconductor layers, with the completed light-emitting device it is possible to extract light from the semiconductor layers to outer region efficiently.

Preferably, in the manufacturing method of light-emitting device, wherein the roughness structure on the surface of the semiconductor layers is formed by irradiating the surface of the semiconductor layers with laser beams dedicated to forming the roughness structure along with the irradiation with the laser beams dedicated to separating the transparent crystal substrate.

By such a configuration, it is possible to easily control the shape of the fine structure on the surface by adjusting the irradiation interference conditions of plural laser beams.

For accomplishing the above-mentioned purpose, according to the present invention, a manufacturing method of light-emitting device, comprising:

a substrate forming process in which a semiconductor-substrate is formed by depositing p-type and n-type semiconductor layers on a transparent crystal substrate with a partly non-deposited portion, and by providing semiconductor-surface-electrodes on the semiconductor layers to apply currents into each of the semiconductor layers, wherein each of the electrode surfaces is exposed in one direction;

VIA forming process in which an insulating layer having pre-formed holes for VIA corresponding to the semiconductor-surface-electrodes is laminated on the surface of the semiconductor-substrate where the semiconductor-surface-electrodes are provided, also electric conductors are provided to form VIA's on the surfaces of the semiconductor-surface-electrodes and on the inner walls of the holes for VIA, and also mount-surface-electrodes electrically connected to the semiconductor-surface-electrodes through the VIA are made on the surface of the insulating layer; and substrate separation process in which the transparent crystal substrate is separated off from the semiconductor layers after the VIA forming process.

By such a configuration, it is possible to manufacture low cost and high efficiency light-emitting device by applying the conventional print-circuit board manufacturing process. That is, in the VIA forming process, it is possible to prepare the insulating layer having pre-formed holes by applying the conventional print-circuit board process, and by attaching such a insulating layer on the semiconductor-substrate the insulating layer to support the semiconductor layers and the mount-surface-electrodes to mount the device are easily formed. The light-emitting devices completed by the removal of transparent crystal substrate are, in the same way as describe above, capable of surface mounting and capable of direct extraction of the light from the semiconductor layers, and thus this light-emitting device is excellent in both of mountability and light-emitting efficiency, and can be manufactured at low cost.

Preferably, in the manufacturing method of light-emitting device, wherein the insulating layer is made of one of resin, ceramics, or silicon.

By such a configuration, in the same way as describe above, the availability of the insulating layer material is enlarged, and then it is possible to get such light-emitting devices having reasonably selected material for the insulating layer in respect of the manufacturing cost or products performance.

Preferably, in the manufacturing method of light-emitting device, wherein the holes in the insulating layer are formed by exposing the insulating layer to laser beams or plasma.

By such a configuration, in the case that laser beams are used, as describe above, it is possible to selectively remove only insulating layer, and also high-precision processing can be done. Furthermore, no vacuum system is necessary, and then it is possible to process in the atmosphere conveniently and in high speed. In the case that plasma is used, as describe above, it is possible to process many number of VIA, and also many substrates can be processed in batch to form VIA efficiently.

Preferably, in the manufacturing method of light-emitting device, wherein the separation of the transparent crystal substrate in the substrate separation process is done by using laser beams.

By such a configuration, as describe above, it is possible to remove the transparent crystal substrate with the least damage to the semiconductor by concentrating energy in space and time, and this is done conveniently in the atmosphere and in high speed.

Preferably, in the manufacturing method of light-emitting device, wherein a roughness structure is formed on a separation-induced surface of the semiconductor layers simultaneously with the separation of the transparent crystal substrate from the semiconductor layers by using laser beams.

By such a configuration, as describe above, it is possible to cut down the operation for set-up or arrangement. Furthermore, since the light reflection at the surface of the semiconductor layers for outgoing light is suppressed by the roughness structure on the surface of the semiconductor layers, with the completed light-emitting device it is possible to extract light from the semiconductor layers to outer region efficiently.

Preferably, in the manufacturing method of light-emitting device, wherein the roughness structure on the surface of the semiconductor layers is formed by irradiating the surface of the semiconductor layers with laser beams dedicated to forming the roughness structure along with the irradiation with the laser beams dedicated to separating the transparent crystal substrate.

By such a configuration, as describe above, it is possible to easily control the shape of the fine structure on the surface by adjusting the irradiation conditions of both laser beams.

BEST MODE FOR CARRYING OUT THE INVENTION

Figure 1:
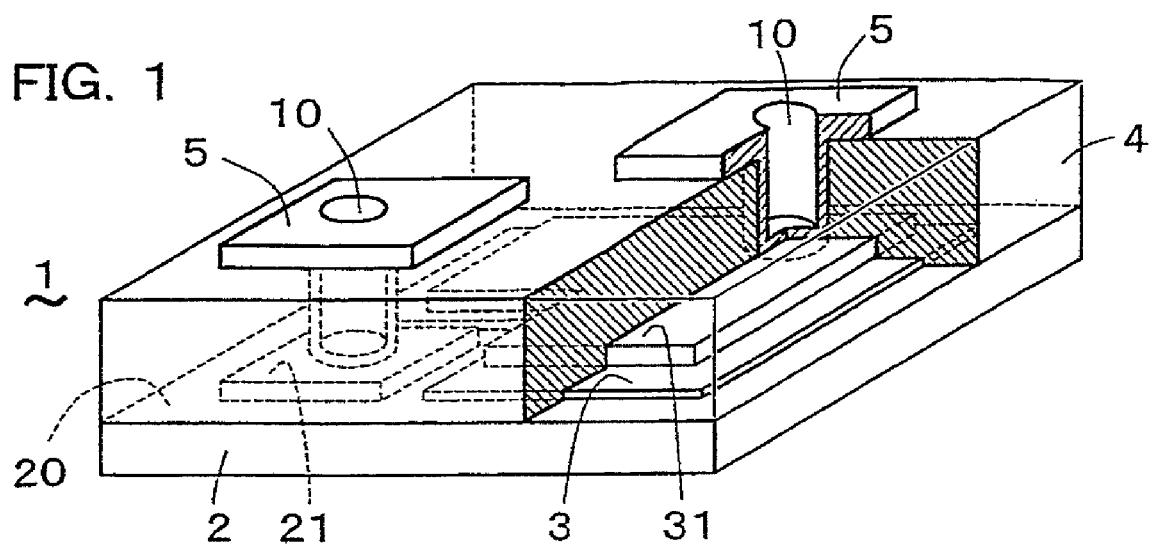
FIG. 1 is a perspective view partly containing a sectional view showing a light-emitting device in accordance with an embodiment of the present invention.
Figure 2:
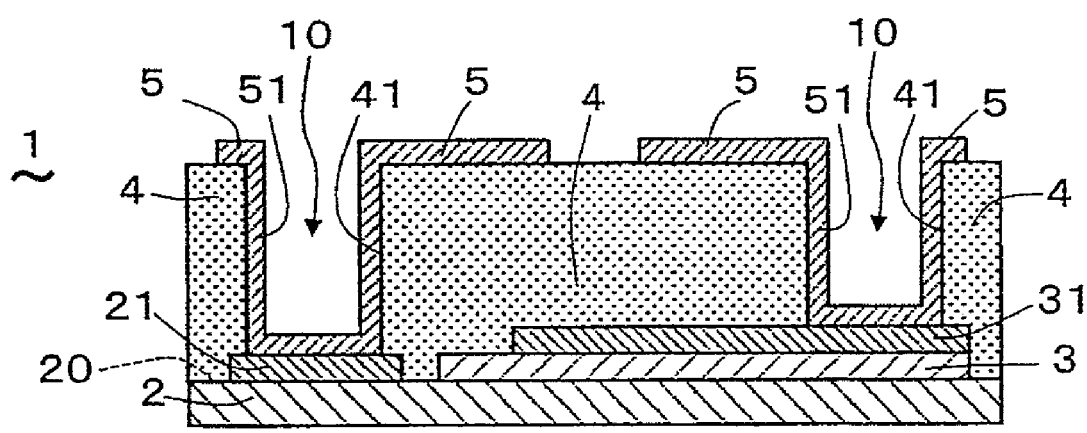
FIG. 2 is a sectional view showing the above-mentioned light-emitting device.

A light-emitting device and its manufacturing method in accordance with embodiments of the present invention is described with reference to the drawings. FIG. 1 and FIG. 2 show a light-emitting device 1 of present invention. The light-emitting device 1 comprises semiconductor layers 2, 3 made up of p-type and n-type nitride semiconductor layers, semiconductor-surface-electrodes 21, 31 to apply currents into each of the semiconductor layers 2, 3, an insulating layer 4 which holds the semiconductor layers 2, 3, and mount-surface-electrodes 5 provided on one surface (top side in the figure) of the insulating layer 4 which is opposite to the other surface of the insulating layer with which the semiconductor-surface-electrodes 21, 31 are in contact. One semiconductor layer 2 has a non-deposited area 20 where the other semiconductor layer 3 is not deposited, and one semiconductor-surface-electrode 21 is built up on the surface of the non-deposited area 20. The mount-surface-electrodes 5 and the semiconductor-surface-electrodes 21, 31 are electrically connected by electrical conductor 51 provided on the inner wall of the VIA holes 41 formed in the insulating layer 4. The semiconductor-surface-electrodes 21, 31, the insulating layer 4, and the mount-surface-electrodes 5 are built up in this order on one side of the deposited semiconductor layers 2, 3.

In the above-mentioned light-emitting device 1, the semiconductor layer 2 is, for example, n-type semiconductor, and the semiconductor layer 3 is p-type. Reverse order is also possible, that is, the semiconductor layer 3 is n-type semiconductor and the semiconductor layer 2 is p-type semiconductor. Those semiconductor layers 2, 3 have an active layer in the two layers interface forming the light-emitting diode (LED). One surface (bottom side in the figure) of the deposited semiconductor layers 2, 3 of the light-emitting device 1 is a light extraction surface. The other surface (top side in the figure) is a mount-surface and the mount-surface-electrodes 5 are formed there.

With such a configuration, the light-emitting device 1 comprises mount-surface-electrodes 5 on the surface opposite the light-emitting surface, and because of this fact, the light-emitting device 1 can be treated as a surface-mount device which is mounted on a print-circuit board, and the mounting method used for the print-circuit board can be applied for the mounting of the light-emitting device. This means that the semiconductor mount technologies such as wire-bonding, flip-chip-bonding, or the like are not required, and the surface mount technologies such as solder re-flow, or the like can be utilized. Furthermore, since the light extraction surface of the light-emitting device 1 is not covered by transparent crystal substrate such as sapphire, light beams can be extracted directly and efficiently to outside from the semiconductor layers 2, 3.

The light-emitting device shown in FIG. 1 and FIG. 2 is of a single device type having one pair of semiconductor-surface-electrodes 21, 31 and one pair of mount-surface-electrodes 5, 5 associated with the former. Such a light-emitting device 1 is firstly manufactured in batch process in a combined state of many light-emitting devices as a planar array, and secondly they are diced into each chips. The planar array of the light-emitting devices can be used without dicing or with dicing into a lump containing given number of light-emitting devices.

(Process Flow)

Figure 3A:
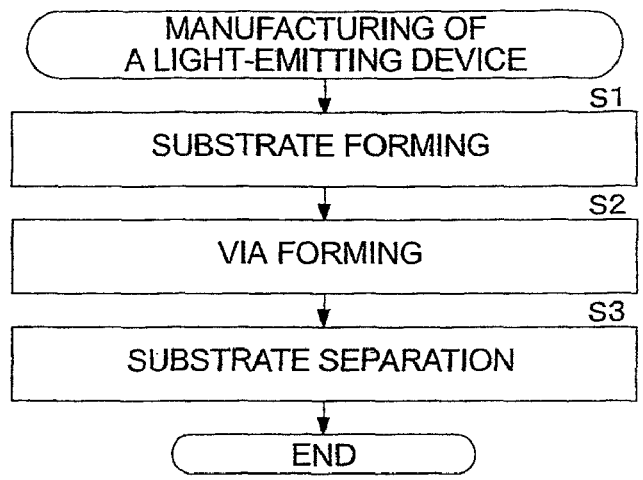
FIG. 3A, FIG. 3B, and FIG. 3C are flow charts showing processes for manufacturing methods of a light-emitting device in accordance with embodiments of the present invention.

The process flow of the light-emitting device 1 is described. FIG. 3A shows a brief summary of the manufacturing process. Hereinafter FIG. 2 is referred too whenever occasion requires. In the first step of the manufacturing of the light-emitting device 1, that is, in substrate forming process (S1), a semiconductor-substrate is formed by depositing p-type and n-type semiconductor layers 2, 3 on a transparent crystal substrate with a partly non-deposited area 20, and by providing semiconductor-surface-electrodes 21, 31 on the semiconductor layers 2, 3 to apply currents into each of the semiconductor layers 2, 3, wherein each of the electrode surfaces is exposed in the same direction.

Next, in VIA forming process (S2), an insulating layer 4 is formed on the surface of the semiconductor-substrate where the semiconductor-surface-electrodes 21, 31 are provided, and mount-surface-electrodes 5 which are electrically connected to the semiconductor-surface-electrodes 21, 31 are formed on the surface of insulating layer 4. In VIA forming process (S2), two types of method are utilized as shown in later.

Figure 3B:
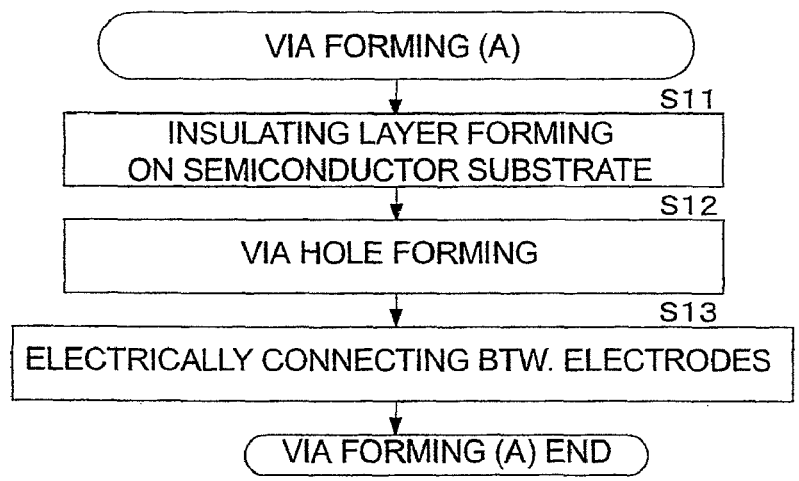
Figure 3C:
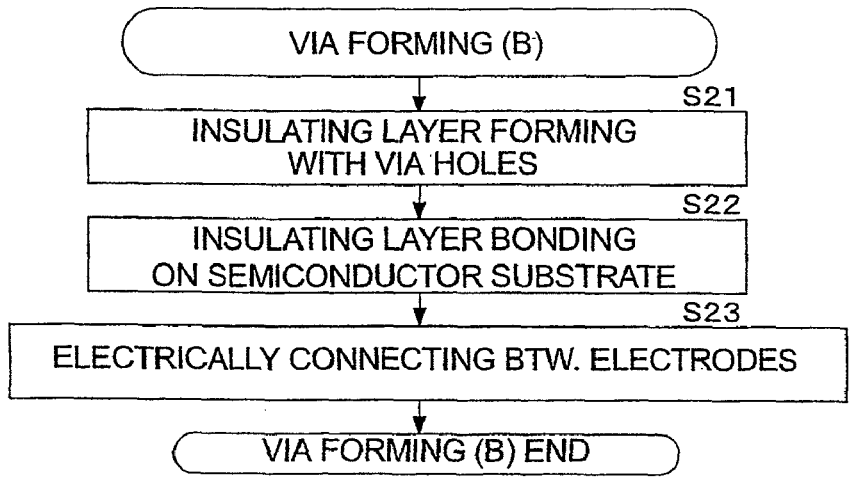

Last, in substrate separation process (S3), the transparent crystal substrate is separated and removed off from the semiconductor layer 2, and the light-emitting device is completed Two methods applicable to above-mentioned VIA forming process (S2) are shown in FIG. 3B and FIG. 3C. In VIA forming process (A), as shown in FIG. 3B, firstly, insulating layer is formed on the surface of the semiconductor-substrate (S11), secondly, holes for VIA are formed in the insulating layer (S12), lastly, the semiconductor-surface-electrodes and mount-surface-electrodes are electrically connected (S13). Processes shown later in FIG. 4A-4E, FIG. 5A-5E, FIG. 6, FIG. 7, FIG. 8, FIG. 16 are related to the VIA forming process (A).

In VIA forming process (B), as shown in FIG. 3C, firstly, insulating layer is formed which has pre-formed holes for VIA corresponding to the semiconductor-surface-electrodes (S21), secondly, the insulating layer is laminated on the surface of the semiconductor-substrate where the semiconductor-surface-electrodes are provided (S22), lastly, the semiconductor-surface-electrodes and mount-surface-electrodes are electrically connected (S23). Processes shown later in FIG. 17A-17D, FIG. 18A, FIG. 18B, and FIG. 18C are related to the VIA forming process (B).

(Example 1 of Light-emitting Device Manufacturing)

Figure 4A:
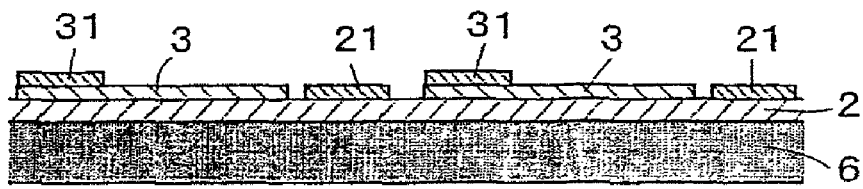
FIG. 4A-4E are sectional views of a light-emitting device showing processes in time-series for the above-mentioned manufacturing methods.

The manufacturing method of the light-emitting device 1 is described with concrete example. FIG. 4A-4E show sectional views at typical stage of manufacturing processes in time-series, and FIG. 5A-5E show the perspective views corresponding to those figures. Firstly, as shown in FIG. 4A and FIG. 5A, n-type nitride semiconductor layer 2 is deposited on the surface of the transparent crystal substrate 6, and p-type nitride semiconductor layer 3 is deposited on it in a manner that some part of the semiconductor layer 2 is exposed without lamination. Subsequently, semiconductor-surface-electrodes 21 for semiconductor layer 2 are formed on the non-deposited area 20 where the semiconductor layer 2 is largely exposed, and also semiconductor-surface-electrodes 31 are formed on semiconductor layer 3. Thus above-mentioned semiconductor-substrate is completed.

Figure 4B:
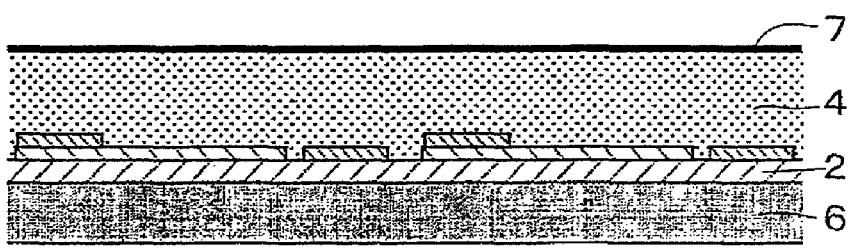
Figure 5A:
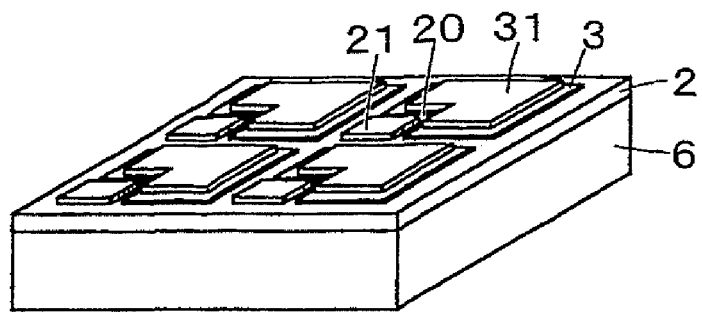
FIG. 5A-5E are perspective views corresponding to the above-mentioned FIG. 4A-4E.
Figure 5B:
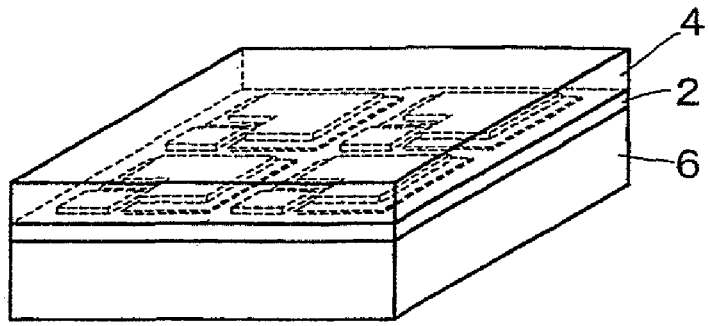

Subsequently, as shown in FIG. 4B and FIG. 5B, a insulating layer 4 and electrical conductor layer 7 are formed on the semiconductor layer 2, 3 and semiconductor-surface-electrodes 21, 31. Those insulating layer 4 and electrical conductor layer 7 are individually formed by resin application, and by metal vapor deposition for example. As alternative method for the individual forming, a resin coated copper which is a print-circuit board material for build-up process, can be laminated on the semiconductor-surface-electrodes 21, 31 as one process. In this case, the insulating layer 4 is made of resin, and the electrical conductor layer 7 is made of copper film. The resin in a resin coated copper can be pure resin or filler containing resin such as glass fiber or the like.

The case that resin coated copper is used, as an insulating layer 4 to be laminated on the semiconductor-surface-electrodes 21, 31, is described. By using the resin coated copper, it is possible to easily laminate an insulating layer for manufacturing light-emitting devices. For example, resin coated copper of epoxy resin type R-0880 manufactured by Matushita Electric Works, Ltd. can be used as follows. The resin coated copper is placed on the semiconductor-substrate, and pressed by a pressing machine at 3.1 Mpa, and under this situation, the resin coated copper temperature is kept at 165 degrees centigrade for 60 minutes or over, and then by cooling, lamination is completed. In the process, it is preferable to process in the vacuum state 13.3 kPa. During the pressing for lamination, it is possible to make wraparound resin at the end faces where semiconductor layers appear, and thus made wraparound resin can protect the semiconductor layers at the end faces. Therefore, damage to the semiconductor layers in the post process is suppressed by the wraparound resin.

Figure 4C:
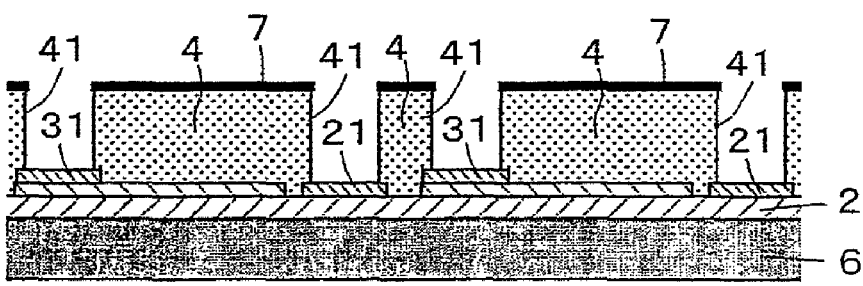
Figure 5C:
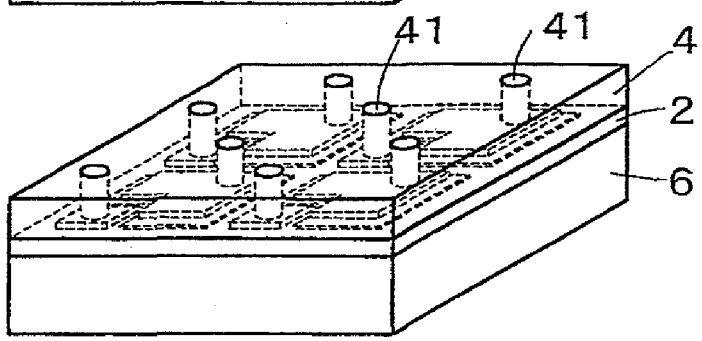

Subsequently, VIA hole patterns are made in the electrical conductor layer 7, and as shown in FIG. 4C and FIG. 5C, the resin on the semiconductor-surface-electrodes 21, 31 is partly removed by the method described later. By this process, VIA holes 41 are formed. After the formation of VIA holes 41, chemical etching may be done in order to remove the resin residual on the surface of the semiconductor-surface-electrodes 21, 31.

Figure 4D:
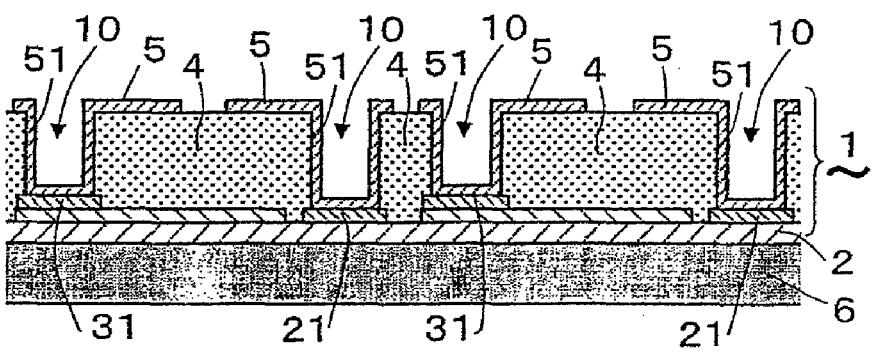
Figure 5D:
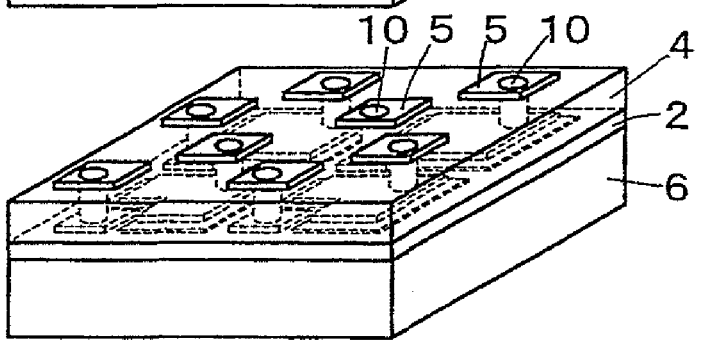

Subsequently, as shown in FIG. 4D and FIG. 5D, patterned mount-surface-electrodes 5, and VIA 10 are formed by making plating layer on the surface of inner walls of the VIA holes 41, of mount-surface-electrodes of the insulating layer, and on semiconductor-surface-electrodes. With VIA 10, the semiconductor-surface-electrodes 21, 31 and the mount-surface-electrodes 5 are electrically connected. Electric conductive paste may be used to fill the VIA holes 41 and to get electrical connection between both of the electrodes. After the processes mentioned above, the light-emitting device 1 on the transparent crystal substrate 6 is completed. Above-mentioned processes for semiconductor-surface-electrodes 21, 31, VIA 10, and mount-surface-electrodes 5 are conventional in the print-circuit board manufacturing process.

Figure 4E:
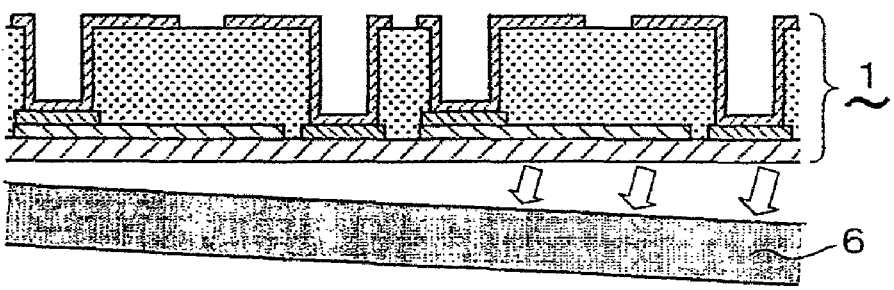
Figure 5E:
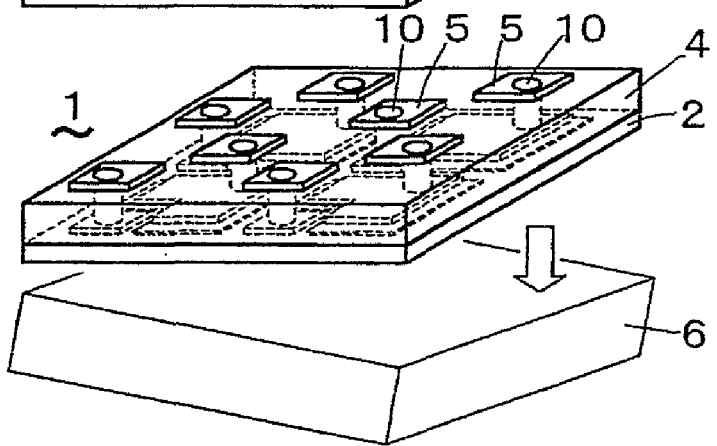

Subsequently, as shown in FIG. 4E and FIG. 5E, in substrate separation process, the transparent crystal substrate 6 and light-emitting devices 1 are separated to get the light-emitting devices 1. Thus obtained light-emitting devices 1 are lump of a single light-emitting device 1, and therefore, if necessary, a single light-emitting device 1 is available by dicing. The substrate separation process is also described later.

(Formation of the Via Holes)

Figure 6:
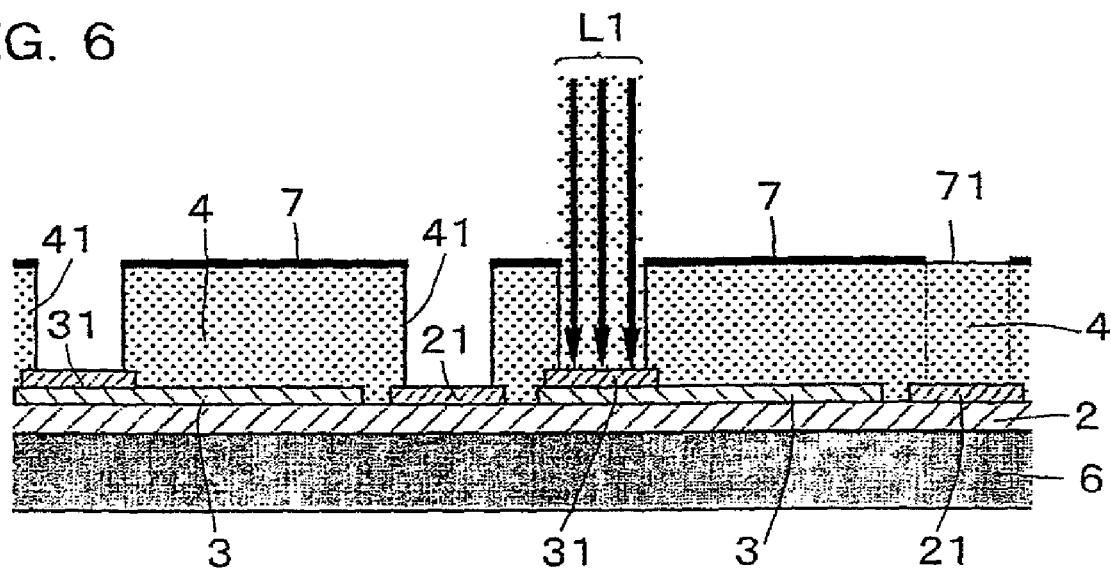
FIG. 6 is a sectional view showing a VIA forming process of the above-mentioned manufacturing methods.

A series of methods to make the VIA holes by removing insulating layer 4 is described. FIG. 6 shows a situation that the VIA holes 41 are made by laser beams L1. The case that the insulating layer 4 is made by resin coated copper is described. Laser beams L1 can be used to form VIA holes 41 by removing regionally the insulating layer, that is, the region laminated on the semiconductor-surface-electrode 21, 31. Usable laser in the process is $CO_2$ laser, harmonic YAG laser, excimer laser, or the like. If the hole diameter is $\phi 50$ μm over, $CO_2$ laser is well-adopted, and if less than $\phi 50$ μm, harmonic YAG laser is well-adopted.

In the case that $CO_2$ laser is used, and if electric conductive layer (copper film) 7 exists on the surface of the insulating layer, as shown in FIG. 6, it is necessary firstly to make openings 71 by removing copper films at the place VIA is to be formed. Such copper films can be removed by resist patterning and copper etching. Alternatively, it is also realistic to form only insulating layer 4 without using the resin coated copper, and to make VIA holes in the insulating layer with laser beams L1, and then to make mount-surface-electrodes on the insulating layer.

If harmonic YAG laser is used, copper films can be removed by laser. Therefore, in this case, above-mentioned etching to make openings 71 is not necessary. The damage to the inner layers, that is, to the semiconductor-surface-electrodes 21, 31, can be avoided to select different processing energy between copper film processing and resin processing. Excimer laser can be used in the case that large area is processed and quality of processing is important too.

When thickness of 60 μm epoxy resin is processed with $CO_2$ laser, the processing energy is from 1 mJ to 10 mJ per $\phi 100$ μm. In such a process, it is important to prevent the occurrence of the damage in the inner semiconductor-surface-electrodes. If $CO_2$ laser is used for processing, some resin remains on the surface of the inner semiconductor-surface-electrodes 21, 31. Therefore, after the VIA hole processing to the insulating layer 4 with $CO_2$ laser, the semiconductor-substrate is dipped into the permanganic acid solution or chromic acid solution to oxidize and resolve the resin, and the remained resin can be removed. The permanganic acid potassium solution can be used in place of the permanganic acid solution, and chromic acid potassium solution can be used in place of chromic acid solution.

The process using the permanganic acid solution is described with concrete example. The semiconductor-substrate having the insulator layer which is processed by above-mentioned VIA hole processing is dipped 5 minutes in the 80 degree centigrade MLB211 solution, which is manufactured by Shipley Company L.L.C, and after this swelling process, in order to oxidize and resolve the resin the semiconductor-substrate is dipped 5 minutes in the 80 degree centigrade MLB213 solution, which is a solution containing permanganic acid and also is manufactured by Shipley Company L.L.C. Next, after water washing, the semiconductor-substrate is dipped 5 minutes in the 10% sulfuric acid solution to neutralize the residuals, and furthermore water washing is done. By those processes, the residual resin on the semiconductor-surface-electrodes 21, 31 is removed by the permanganic acid solution.

As mentioned above, by removing the residual resin on the semiconductor-surface-electrodes 21, 31, which are the bottoms of VIA holes 41, the electrical contact between semiconductor-surface-electrodes 21, 31 and plating layer is not inhibited by residual resin, and the reliability can be maintained for the electrical connection between semiconductor-surface-electrodes 21, 31 and mount-surface-electrodes 5 through the plating layer in the VIA holes 41. Furthermore, if the process for the residual resin is done as mentioned above by using permanganic acid solution or chromic acid solution, the process can be done easily only by dipping the semiconductor-substrate into the solution, and since many semiconductor-substrates can be processed at one time, the process can be done at low cost and high speed.

Figure 7:
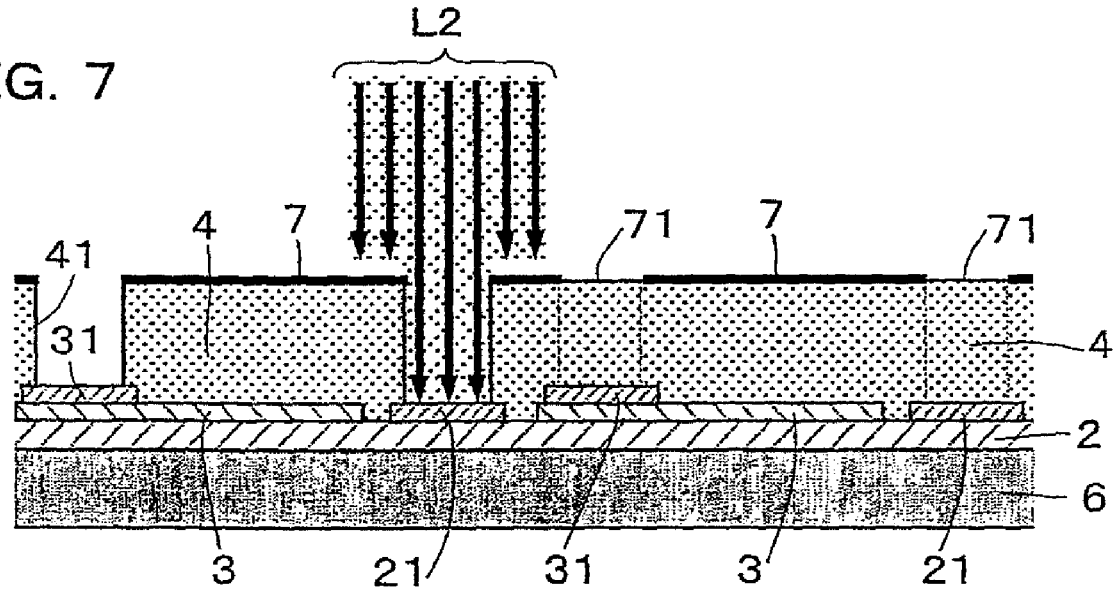
FIG. 7 is a sectional view showing another example for a VIA forming process of the above-mentioned manufacturing methods.

FIG. 7 shows a method to form VIA holes 41 with laser. The case that the insulating layer is formed by resin coated copper is described. In order to make the VIA holes 41 in the insulating layer 4 which have a electrical conductor made of copper film on the surface, firstly, as described above, openings 71 are made by removing the copper films at the place where VIA's to be formed by using resist patterning and copper etching. The copper film around the openings 71 can be used as a mask (copper film mask) for laser processing, and thus precise positioning between laser beams L2 and semiconductor-substrate becomes unnecessary.

As the results, VIA holes 41 can be made with good position accuracy by irradiating the resin through the mask with laser beams L2 of larger diameter spot size than the VIA holes 41 size. As an example, if the diameter of the openings 71 is φ200 μm and the accuracy is ±50 μm, laser beams of diameter φ300 μm spot can be used. In the case of ultra-violet laser, like harmonic YAG laser or excimer laser, a copper mask also can be used. For this, the difference of the processing energy threshold between copper film and resin (the threshold value is higher for copper film than resin) is used, that is, the energy of the laser beams L2 is lowered so as not to damage the mask, and only resin is selectively processed.

Figure 8:
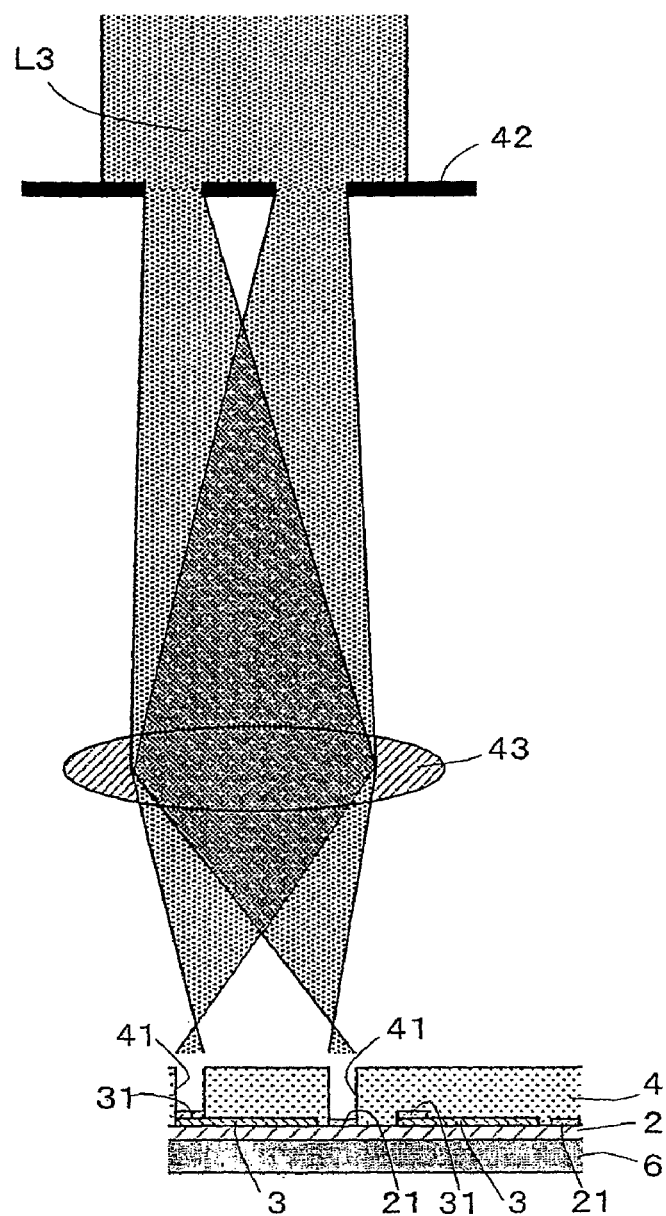
FIG. 8 is a sectional view showing a further example for a VIA forming process of the above-mentioned manufacturing methods.

FIG. 8 shows another method to form VIA holes 41 with laser. The method described here, unlike above-mentioned two methods, is applied to the insulating layer 4 having no copper films. A mask 42 which has enlarged pattern of VIA holes 41 and their layout (processing pattern) is used to irradiate the spots where VIA holes 41 are to be made with laser beams L3. The image of the mask 42 is focused onto the processing point on the insulating layer 4 by focussing lens 43. For example, if the laser processing optical system of image transfer ratio is 1/10, a mask of φ1000 μm opening is used for circular VIA holes of φ100 μm, and a mask of 5000 μm square opening is used for square VIA holes of 500 μm. A mask of 2000 μm opening center distance is used, for the VIA holes center distance of 200 μm. By using such a mask 42 having enlarged processing shape pattern, it is possible to do two dimensional processing in batch, and manufacturing efficiency can be improved.

(Heat Radiation by Via and Surface Mounting)

Figure 9:
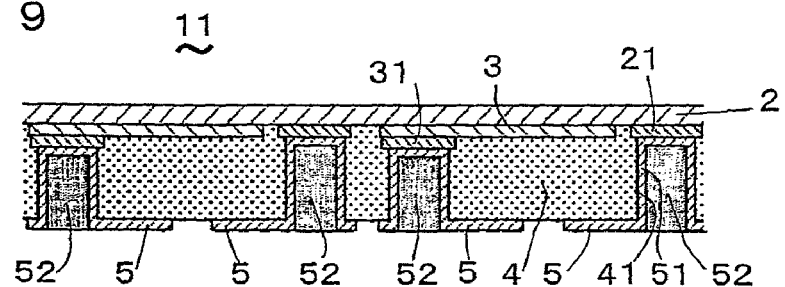
FIG. 9 is a sectional view showing another example of a light-emitting device of the present invention.

The improvement of the heat radiation performance by VIA is described. FIG. 9 shows filled VIA's. When the electrical conductor 51 in the VIA holes 41 is formed, by filling up the VIA holes with electrical conductor 51, which is also good thermal, a filled up VIA structure can be made, and with this structure it is possible to improve the heat radiation of the semiconductor layers 2, 3, that is, light-emitting portion. The filling with the electric conductor can be done by thick plating to the inner surface of the VIA holes 41. Alternatively, the VIA holes 41 may be filled with electric conductive paste. Material of high thermal conductivity is preferable as the filling material. For example, copper (403 W/m/K), silver (428 W/m/K), aluminum (236 W/m/K) are such material. Furthermore, the larger the planar dimension of VIA hole is the better for improvement of heat radiation. The improvement of heat radiation results suppression of thermal load for light-emitting device, and stable light extraction can be achieved.

Figure 10A:
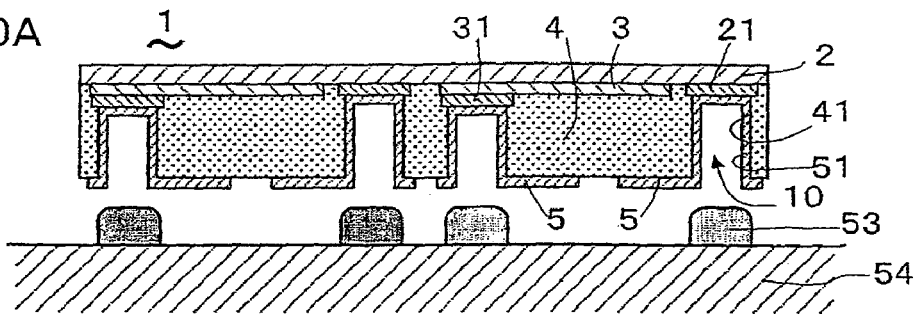
FIG. 10A and FIG. 10B are sectional views showing a mounting process of a light-emitting device of the present invention.
Figure 10B:
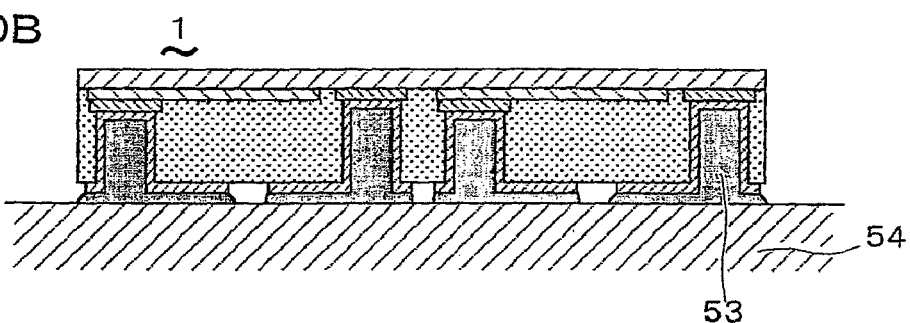

As another filling method for VIA holes 41, as shown FIG. 10A and FIG. 10B, a method using solder is available, where the solder is used for mounting the device onto mounting substrate 54. The thermal conductivity of the solder is, for example, 50 W/m/K, and solder can efficiently dissipate the heat. For the mounting of the light-emitting device, the device mounting process in the print-circuit board technologies can be used, and therefore no special mounting process is necessary, and the mounting process can be made simple too.

(Substrate Separation Process)

Figure 11A:
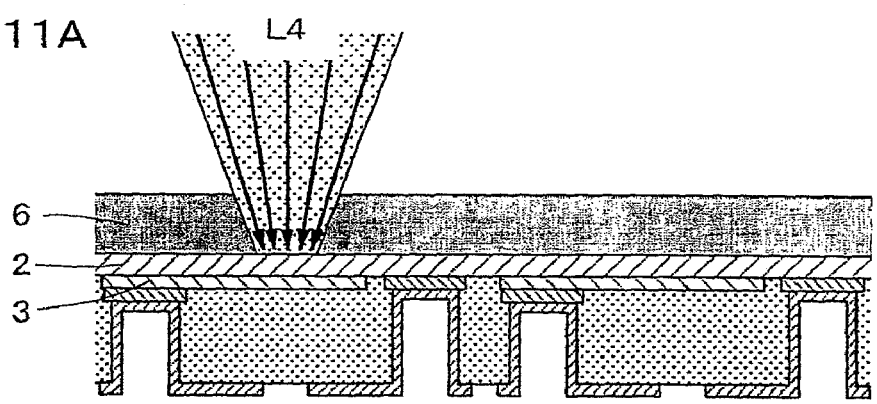
FIG. 11A and FIG. 11B are sectional views showing a substrate separation process of the above-mentioned manufacturing methods.
Figure 11B:
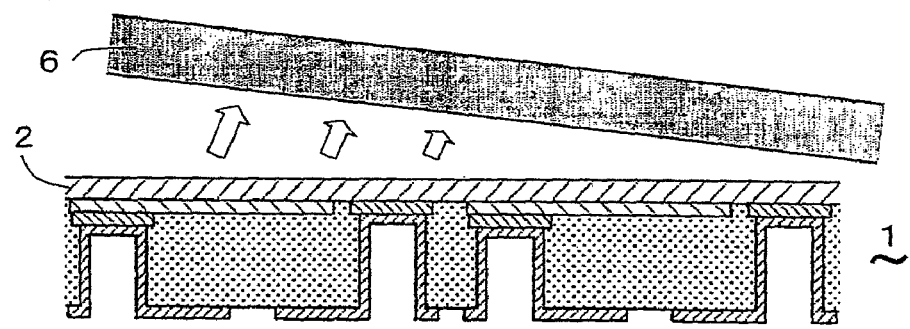

The method to separate the transparent crystal substrate 6 from the light-emitting device 1 is descried. FIG. 11A and FIG. 11B show the substrate separation process done by irradiation with laser beams. When the laser beams are irradiated to the surface of the semiconductor layer 2 through the transparent crystal substrate 6, as described in the background art, the nitride semiconductor on the surface of the semiconductor layer 2, for example, GaN layer is decomposed to metal Ga and $N_2$, and as shown in FIG. 1B, the transparent crystal substrate 6 is separated and removed from the light-emitting device 1. The lasers available for substrate separation are excimer laser (XeCl, KrF, ArF, $F_2$, etc.), THG-YAG laser (the third harmonic laser), FHG-YAG laser (the fourth harmonic laser), ultraviolet laser, and extra short pulse laser of less than 1 ps pulse width (Ti:Sapphire laser and its harmonic laser, excimer laser, etc.) or the like.

If sapphire is used as the transparent crystal substrate 6, since sapphire is transparent for the light from infra-red to about 140 nm wavelength light, those range of laser beams can be used to separate sapphire substrate. In the case that sapphire is used on gallium-nitride layer, the process condition for the temperature of light-emitting device 1 is from 30 to 100 degree centigrade. Here, this temperature is of the light-emitting device 1 under the process, and not of the laser irradiated spot under the laser irradiation. It is not necessary that the temperature of the light-emitting device 1 is set at the time laser processing, but is enough to set temperature up after laser processing. The laser energy density at processing surface is, for example, from 2 to 10 mJ/mm$^2$. The laser irradiation can be done by a method to scan the processing surface with concentrated beams, or by a method to irradiate full surface at once with uniform strength large spot laser beams.

It may happen to occur that metal Ga, which is one of the components of GaN after decomposition to metal Ga and $N_2$, stay on the GaN surface after removal of sapphire substrate. Those Ga can be removed by acid washing, for example, by using HCl solution.

(Process for Light-Emitting Surface)

Figure 12A:
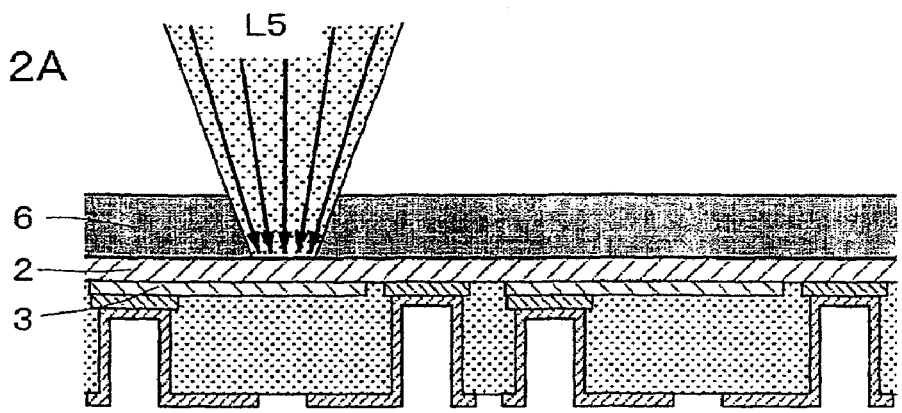
FIG. 12A and FIG. 12B are sectional views showing other examples for a substrate separation process of the above-mentioned manufacturing methods.
Figure 12B:
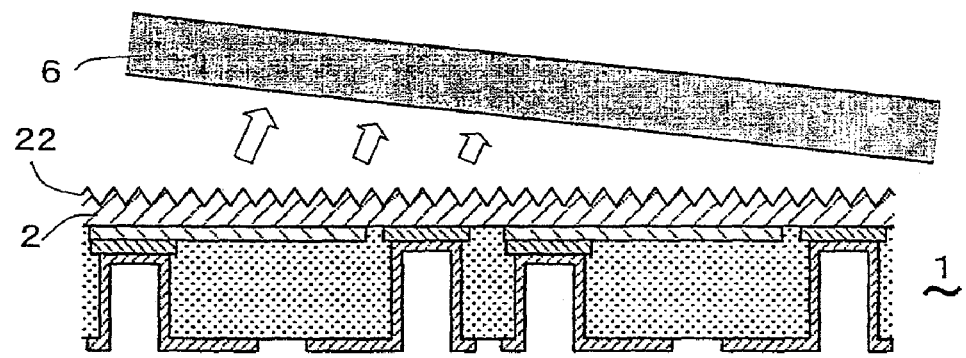

In the following, several processing for the surface of light-emitting device (light-emitting surface) are described. FIG. 12A and FIG. 12B show the formation of a roughness structure by using laser. During the separation process in which the transparent crystal substrate 6 is removed by using laser beams L5, a roughness structure 22 is formed simultaneously on the surface of the nitride semiconductor layer 2, that is, onto surface facing the transparent crystal substrate 6. The roughness structure 22 can be formed by using the interference between incident laser beams and diffused/reflected laser beams, or between multiple number of light beams. The roughness structure 22 can improve the light extraction efficiency.

By giving the periodicity to the roughness structure 22, the light extraction efficiency can be more improved. The reason for improving is that the light beams, which are confined in the light-emitting device because of the difference of index of refraction, can be extracted by the action of diffraction phenomena caused by roughness structure. For example, with a roughness structure 22 of 1000 nm period and 1000 nm depth on the surface of nitride semiconductor layer 2, the light extraction efficiency is doubled. There is the same effect with a roughness structure 22 of 1500 nm period and 750 nm depth. As mentioned above, it is possible to efficiently extract light beams from the light-emitting device 1 to outward by utilizing the roughness structure 22, and since the roughness structure 22 can be formed simultaneously with the separation process, such a effect can be get by few process step.

Figure 13:
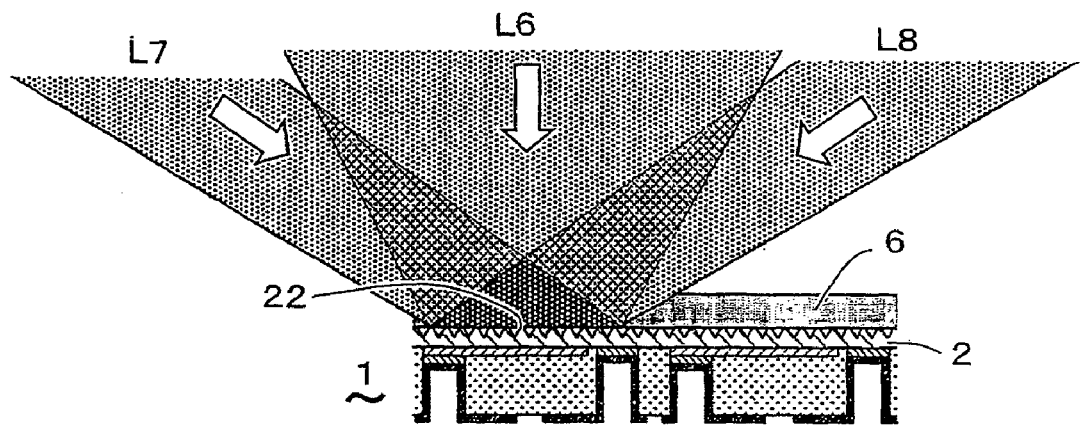
FIG. 13 is a sectional view showing a further example for a substrate separation process of the above-mentioned manufacturing methods.

FIG. 13 shows another example of the formation of a roughness structure by using laser. When the separation of the transparent crystal substrate 6 is done by laser beams L6, other laser beams L7, L8 which are dedicated to forming the roughness structure 22 are used along with the laser beams L6 in order to form the roughness structure 22 on the surface of the nitride semiconductor layer 2, that is, on the surface which faces the transparent crystal substrate 6. The laser beams L6 go from vertical direction to the front face of the light-emitting device 1, and the laser beams L7, L8 dedicated to forming the roughness structure 22 go from oblique direction. If multiple number of laser beams are used as the laser beams and if their interference is used for forming the roughness structure 22, the control of the shape of the surface micro structure is easily done, and also it is possible to give periodicity to the structure. As described above, by giving the periodicity to the roughness structure 22, the light extraction efficiency from the light-emitting device 1 can be more improved.

Figure 14:
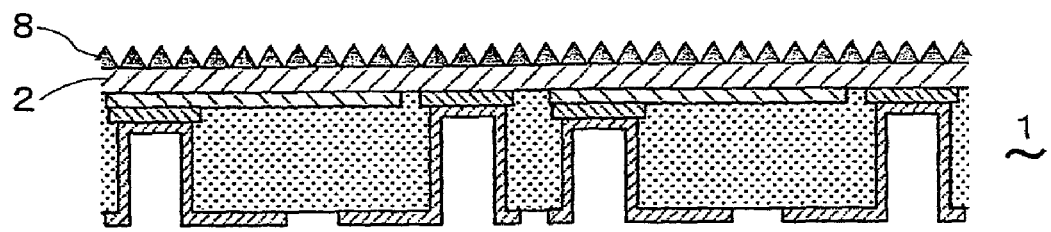
FIG. 14 is a sectional view showing a light-emitting device of the present invention having a roughness structure on a surface of the semiconductor layers.

FIG. 14 shows another method of the formation of the roughness structure for the purpose of improving the light extraction efficiency. In this method, a transparent optical part 8, which has a surface of micro roughness structure, is put on the surface of the nitride semiconductor layer 2, where the transparent crystal substrate 6 was removed. The index of refraction of the nitride semiconductor (GaN) is 2.5, and this is very high. On the other hand, the index of refraction of the atmosphere, where light beams are extracted in, is 1.0, and therefore the ratio of the two indices is 2.5. Therefore, in this condition, the critical angle is small for the light goes from the semiconductor layer 2 to the atmosphere, and then the light tend to be trapped by total reflection, so the light extraction loss is large. Thus, the transparent optical part 8 which has a surface of micro roughness structure, is formed with such transparent material that the index of refraction is over the value, X/3+Y, where X is the difference between the indices of refraction of nitride semiconductor and atmosphere, and Y is the index of refraction of atmosphere. Preferably, the roughness structure has surface-roughness of from 0.1 to 100 μm, and has periodicity too. For example, if quartz glass is used as the material of the transparent optical part 8, its index of refraction is about 1.5, index of refraction of GaN is 2.5, and index of refraction of atmosphere is 1.0, and therefore above-mentioned condition is satisfied, and it is possible to improve the light extraction efficiency. The index of refraction of the transparent optical part 8 is the higher, the better, and sapphire (index of refraction: 1.77) may be used.

Figure 15:
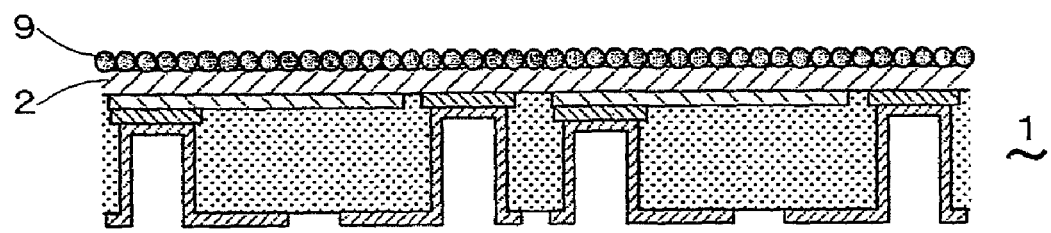
FIG. 15 is a sectional view showing a light-emitting device of the present invention having phosphor on the surface of the semiconductor layers.

FIG. 15 shows the processing for the semiconductor surface, which relates to the color tone conversion (wavelength conversion). By providing phosphor 9 on the surface or in the interior portion of the semiconductor layer 2, it is possible to convert the color tone of the light emitted by the light-emitting device 1 into another color tone with high efficiency by using the phosphor 9. Furthermore, in the case that the light-emitting device 1 is sealed with resin or the like, by this configuration it is possible to suppress the deterioration of the sealing resin than the sealing resin in which phosphor is dispersed. The phosphor 9 is provided for the semiconductor layer 2 after the removal of the transparent crystal substrate which is removed, as described above, by laser beams in the separation process. The phosphor 9 is provided on the surface of the nitride semiconductor layer 2, or is doped in the interior of the semiconductor layer 2. As to kind of the phosphor 9, for example, a material which converts blue color to yellow color, or emits green and red colors is used for the blue light-emitting nitride semiconductor, and a material which emits blue, green, and red colors is used for the ultra violet light-emitting nitride semiconductor. By providing phosphor on the surface or in the interior portion of the nitride semiconductor, it is possible to efficiently inject the emitted light into phosphor, and it is possible to suppress the deterioration of the sealing resin which is used to seal the light-emitting device.

The doping of the phosphor into the surface (or inner region) of the nitride semiconductor layer can be done firstly, by irradiating the surface, for example, with laser beams to make softened surface, and secondly by irradiating the softened surface with accelerated phosphor particles. The laser condition to soften the surface is, for example, (1) for femto-second laser: wavelength 800 nm, pulse width 120 fs, pulse repeat frequency 1 kHz, and processing energy density 0.001-0.05 J/mm$^2$, (2) for excimer femto-second laser: wavelength 248 nm, pulse width 270 fs, pulse repeat frequency 350 Hz, and processing energy density 0.01-1.0 J/mm$^2$. If nanometer size of accelerated phosphor particles is used, color tone can be converted with higher efficiency.

(Another Example of the Insulating Layer Forming)

Figure 16:
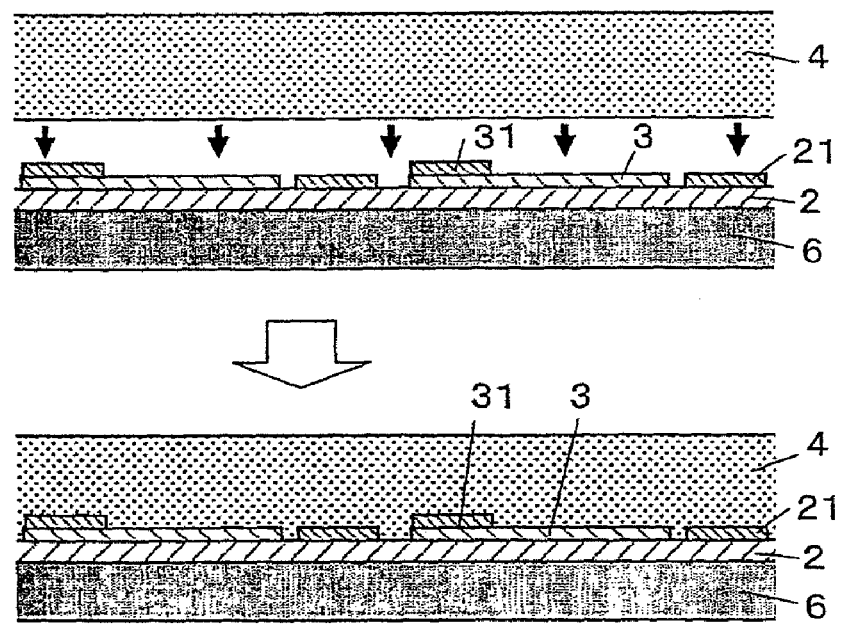
FIG. 16 is a sectional view showing other examples for a manufacturing method of a light-emitting device of the present invention.

Another example of manufacturing method of the light-emitting device 1 is described with reference to FIG. 16. In this manufacturing method, VIA forming process (A) is used in the same method as described above, and after forming the insulating layer 4 on the surface semiconductor layers, VIA holes are formed in the insulating layer. Here, unlike above-mentioned resin or resin coated copper, the case that ceramics or silicon is used as the material for insulating layer 4, is described. Ceramics or silicon wafer is bonded to semiconductor layers 2, 3 and also semiconductor-surface-electrodes 21, 31 of the semiconductor-substrate. Alumina may be used as the ceramics wafer. Those can be bonded together between surfaces by pressing them under clean and activated surface condition.

As to above-mentioned bonding, there are several type of bonding methods for metal-metal bonding (diffusion bonding, pressure welding, and ultrasonic bonding, or the like), and in the case of insulator-semiconductor bonding, bonding can be done by cleaning process in which bonding surfaces are cleaned, for example, by using Ar ion bombardment, and by pressing process in which two wafers are stacked up facing each cleaned surface and pressed to be bonded under room temperature. It is also realistic to apply low melting temperature glass on the bonding surfaces of insulating layer 4 and semiconductor-substrate, and to bond by using the glass. Thus made insulating layer 4 which is bonded on the semiconductor-substrate can be processed as mentioned above, that is, VIA holes can be made by using laser in the insulating layer 4 made of ceramics or silicon, and VIA's and mount-surface-electrodes are formed by using plating.

If the insulating layer 4 is made of silicon, VIA holes can be made by plasma etching.

(Example 2 of Light-Emitting Device Manufacturing)

Figure 17A:
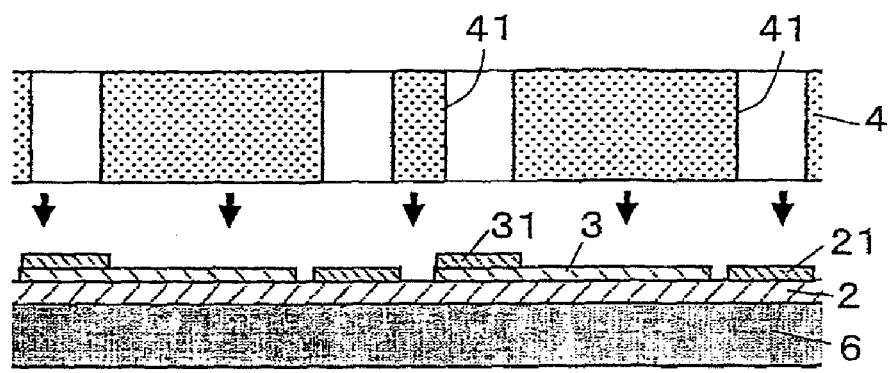
FIG. 17A-17D are sectional views showing other examples for a manufacturing method of a light-emitting device of the present invention.

Another manufacturing method of the light-emitting device 1 is described with reference to FIG. 17A-17D. This manufacturing method uses the VIA forming process (B) shown in FIG. 3C. As shown in FIG. 17A, the insulating layer 4, in which VIA holes 41 corresponding to the semiconductor-surface-electrodes 21, 31 are pre-formed, is laminated and bonded to semiconductor layers 2, 3 and also semiconductor-surface-electrodes 21, 31 of the semiconductor-substrate.

As the material of insulating layer 4 for bonding use, resin, resin coated copper, ceramics for example alumina, and silicon can be used. The method to make VIA holes 41 in the insulating layer made of those material is practically the same as mentioned above, and the method using laser beams can be applied. In the case of silicon, VIA holes 41 can be made by plasma etching. In the case of ceramics, the ceramic insulating layer 4 may be prepared by firing of the green sheet in which holes are made corresponding to the VIA holes. In the case of resin or resin coated copper, VIA holes 41 can be opened easily by punching or drilling, since those holes are through holes.

Figure 17B:
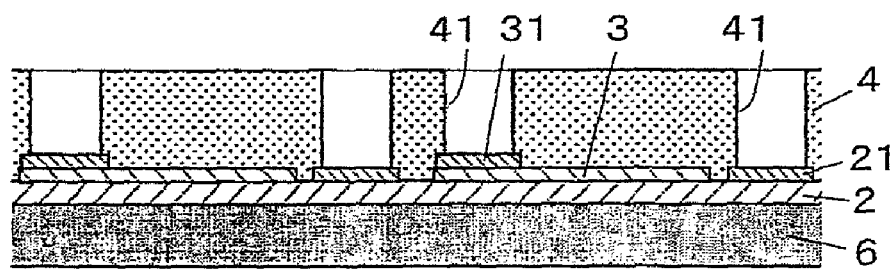
Figure 17C:
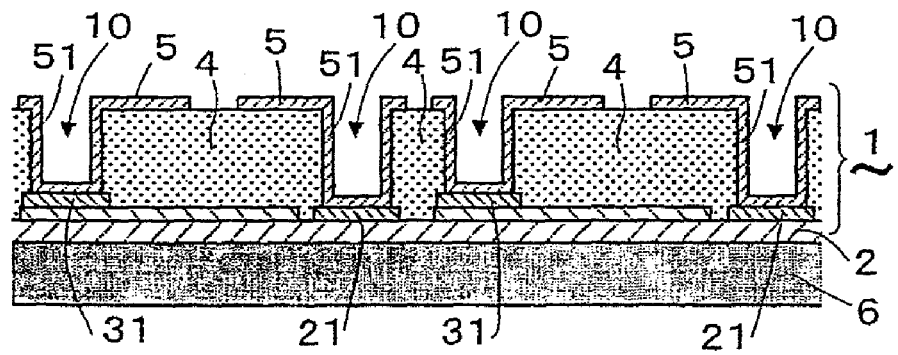
Figure 17D:
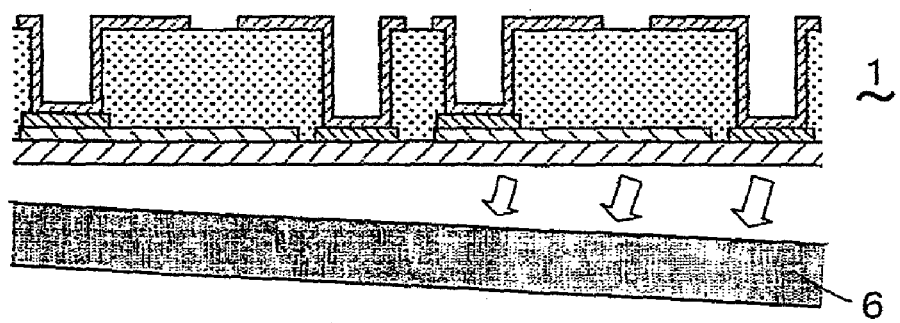

FIG. 17B shows the situation that insulating layer 4 is bonded on the semiconductor substrate. If the insulating layer 4 is of resin, the bonding can be done with above-mentioned epoxy type R-0880, and in the same method mentioned above. If the insulating layer 4 is of ceramics or silicon, the bonding can be done by the method described with reference to FIG. 16. The formation of the mount-surface-electrodes 5, and electrical connection between electrodes through the electrical conductor 51 in the VIA holes 41 shown in FIG. 17C, and separation of the semiconductor-substrate shown in FIG. 17D can be done by using one of the above-mentioned methods.

(Example 3 of Light-Emitting Device Manufacturing)

Figure 18A:
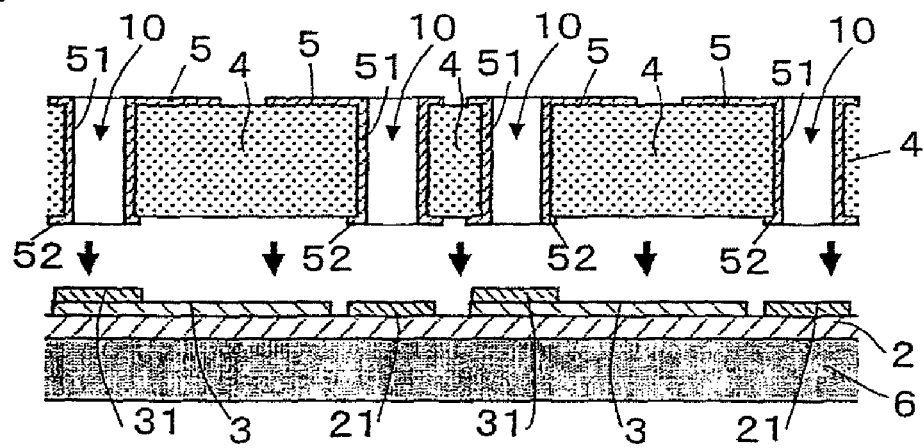
FIG. 18A, FIG. 18B, and FIG. 18C are sectional views showing still further examples for a manufacturing method of a light-emitting device of the present invention.

Other manufacturing method of the light-emitting device 1 is described with reference to FIG. 18A, FIG. 18B, and FIG. 18C. In this manufacturing method, in the same manner mentioned above with reference to FIG. 7A, VIA holes 41 are pre-formed in the insulating layer 4, and moreover, the mount-surface-electrodes 5 and the electrical conductor 51 in the VIA holes 41 are also pre-formed in the insulating layer 4. Furthermore, VIA electrodes 52 which are corresponding to the semiconductor-surface-electrodes 21, 31 are also formed around VIA holes 41 on the surface of the insulating layer 4. Such VIA electrodes 52 are formed electrically and reliably to connect electrical conductor 51 and semiconductor-surface-electrodes 21, 31. In this method, the insulating layer 4 before bonding already has VIA's 10 and mount-surface-electrodes 5, in their final states.

Figure 18B:
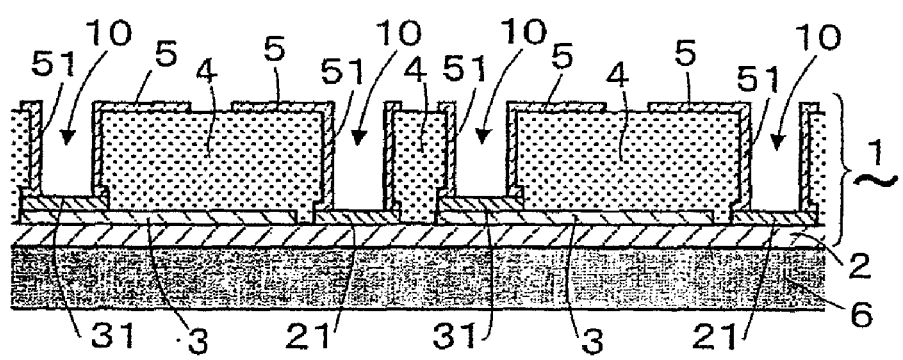
Figure 18C:
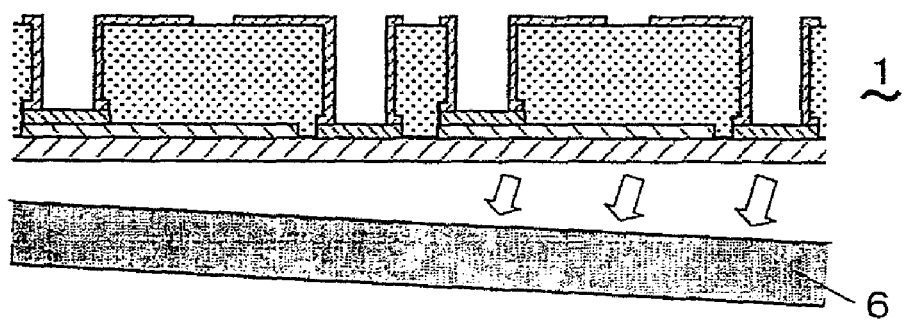
Figure 19A:
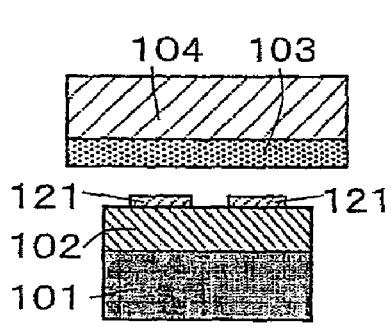
FIG. 19A-19F are sectional views showing manufacturing processes of a conventional laser diode array.
Figure 19B:
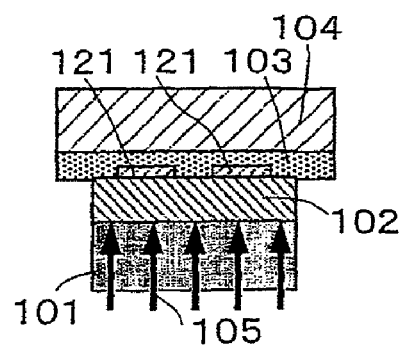
Figure 19C:
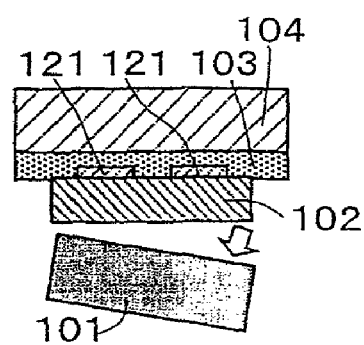
Figure 19D:
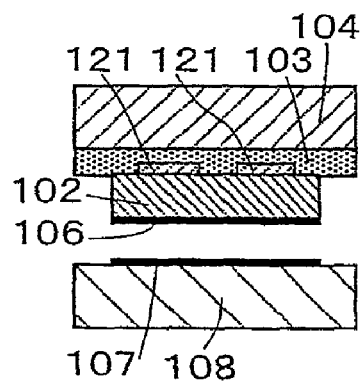
Figure 19E:
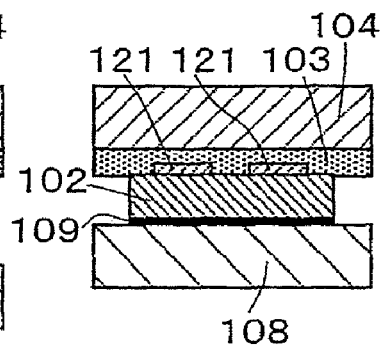
Figure 19F:
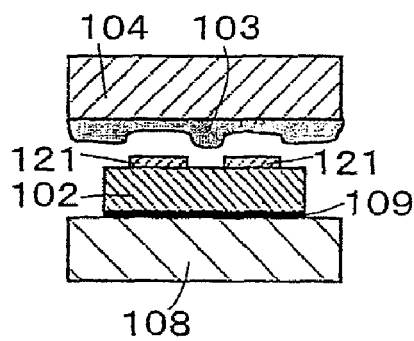

By using such a insulating layer 4 having VIA's 10 and mount-surface-electrodes 5, as shown in FIG. 18B, light-emitting device 1 can be formed by bonding the insulating layer 4 and semiconductor-substrate together. The bonding can be done by using one of the above-mentioned methods. Furthermore, as shown in FIG. 18C, light-emitting device 1 from which the transparent crystal substrate is removed, can be obtained by using one of the above-mentioned methods. Although the present invention has been fully described by way of example with reference to the accompanying drawings, it is to be understood that various changes and modifications will be apparent to those skilled in the art.

The present application claims the priority based upon the patent application filed on Sep. 24, in 2003. The entire contents of the application are incorporated into the present application by reference thereto.

What is claimed is:

1. A manufacturing method of light-emitting device, comprising:
  a substrate forming process in which a semiconductor-substrate is formed by depositing p-type and n-type semiconductor layers on a transparent crystal substrate so that one of the semiconductor layers has a partly non-deposited portion where the other semiconductor layer is not deposited, and by providing semiconductor-surface-electrodes on the semiconductor layers to apply currents into each of the semiconductor layers, wherein each of the electrode surfaces is exposed in one direction;
  VIA forming process in which an insulating layer having pre-formed holes for VIA corresponding to the semiconductor-surface-electrodes is laminated on the surface of the semiconductor-substrate where the semiconductor-surface-electrodes are provided, also electric conductors are provided to form VIA's on the surfaces of the semiconductor-surface-electrodes and on the inner walls of the holes for VIA, and also mount-surface-electrodes electrically connected to the semiconductor-surface-electrodes through the VIA are made on the surface of the insulating layer; and
  substrate separation process in which the transparent crystal substrate is separated off from the semiconductor layers after the VIA forming process.

2. The manufacturing method of light-emitting device of claim 1, wherein the insulating layer is made of one of resin, ceramics, or silicon.

3. The manufacturing method of light-emitting device of claim 1, wherein the holes in the insulating layer are formed by exposing the insulating layer to laser beams or plasma.

4. The manufacturing method of light-emitting device of claim 1, wherein the separation of the transparent crystal substrate in the substrate separation process is done by using laser beams.

5. The manufacturing method of light-emitting device of claim 4, wherein a roughness structure is formed on a separation-induced surface of the semiconductor layers simultaneously with the separation of the transparent crystal substrate from the semiconductor layers by using laser beams.

6. The manufacturing method of light-emitting device of claim 5, wherein the roughness structure on the surface of the-semiconductor layers is formed by irradiating the surface of the semiconductor layers with laser beams dedicated to forming the roughness structure along with the irradiation with the laser beams dedicated to separating the transparent crystal substrate.

* * * * *